(12) United States Patent
Yoon et al.

(10) Patent No.: US 9,128,504 B2
(45) Date of Patent: Sep. 8, 2015

(54) SIGNAL GENERATION CIRCUIT, METHOD OF OPERATING A SIGNAL GENERATION CIRCUIT, AND DEVICE FOR GENERATING AN OUTPUT VOLTAGE

(71) Applicant: SAMSUNG ELECTRONICS CO., LTD., Suwon-Si, Gyeonggi-Do (KR)

(72) Inventors: Gil Won Yoon, Hwaseong (KR); Yus Ko, Yongin (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 293 days.

(21) Appl. No.: 13/755,190

(22) Filed: Jan. 31, 2013

(65) Prior Publication Data
US 2013/0234682 A1   Sep. 12, 2013

(30) Foreign Application Priority Data

Mar. 8, 2012   (KR) ........................ 10-2012-0023750

(51) Int. Cl.
G05F 1/565 (2006.01)
G05F 1/625 (2006.01)
G05F 1/575 (2006.01)

(52) U.S. Cl.
CPC ..................................... G05F 1/625 (2013.01)

(58) Field of Classification Search
USPC .......... 323/238, 239, 241–246, 266, 271, 234
See application file for complete search history.

(56) References Cited

U.S. PATENT DOCUMENTS

| 4,310,891 | A  | * | 1/1982 | Niki ................................ 702/75 |
| 4,920,470 | A  | * | 4/1990 | Clements .................... 363/21.11 |
| 5,144,209 | A  | * | 9/1992 | Inaji et al. ................ 318/400.04 |
| 5,903,451 | A  |   | 5/1999 | Wu et al. |
| 6,906,500 | B2 | * | 6/2005 | Kernahan ...................... 323/225 |
| 7,239,116 | B2 | * | 7/2007 | Tang ............................. 323/282 |
| 7,515,393 | B2 |   | 4/2009 | Bliley et al. |
| 7,649,755 | B2 |   | 1/2010 | Kogel et al. |
| 2004/0022078 | A1 |   | 2/2004 | Shieh |
| 2011/0181199 | A1 | * | 7/2011 | Lin et al. ....................... 315/291 |
| 2012/0242313 | A1 | * | 9/2012 | Ko et al. ....................... 323/282 |

FOREIGN PATENT DOCUMENTS

JP   2002171750   6/2002
KR   200139543    12/1998

* cited by examiner

*Primary Examiner* — Matthew Nguyen
*Assistant Examiner* — Nusrat Quddus
(74) *Attorney, Agent, or Firm* — Voientine & Whitt, PLLC

(57) ABSTRACT

A signal generation circuit includes: a clock signal generator configured to generate a clock signal and to change a frequency of the clock signal in response to a select signal; a transmission control circuit configured to control transmission of the clock signal based on the select signal; and a counter configured to perform an operation among a count operation and a count stop operation based on an output signal of the transmission control circuit and to output the select signal based on a result of performing the operation. When the counter performs the count operation in response to the clock signal output from the transmission control circuit, the counter outputs a most significant bit (MSB) among its count bits as the select signal.

19 Claims, 11 Drawing Sheets

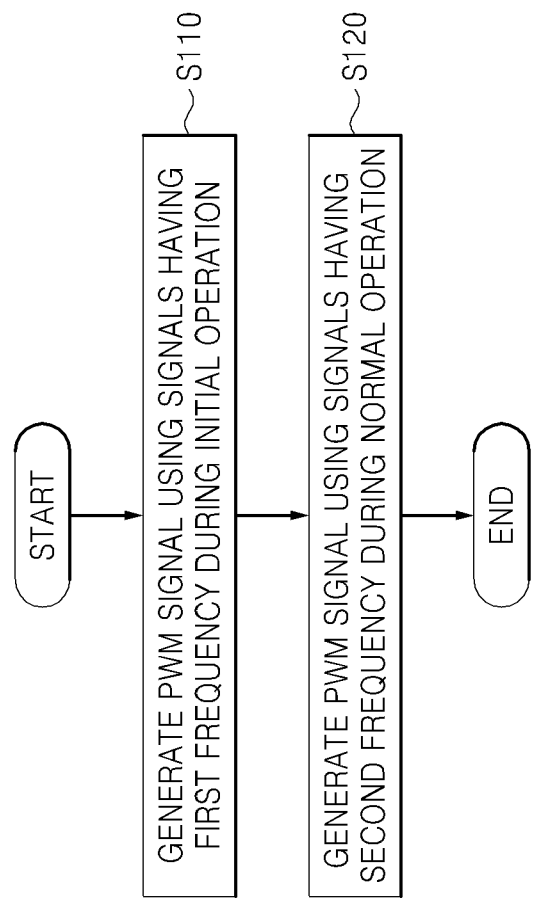

SIGNAL GENERATION CIRCUIT, METHOD OF OPERATING A SIGNAL GENERATION CIRCUIT, AND DEVICE FOR GENERATING AN OUTPUT VOLTAGE

CROSS-REFERENCE TO RELATED APPLICATIONS

This application claims priority under 35 U.S.C. §119(a) from Korean Patent Application No. 10-2012-0023750 filed on Mar. 8, 2012, the subject matter of which is hereby incorporated by reference.

BACKGROUND

Embodiments of the inventive concept relate to a signal generation circuit, and more particularly, to a signal generation circuit for decreasing current flowing in an inductor of an LC low pass filter by decreasing a switching frequency in an initial operation of a direct current to direct current (DC-DC) converter and a method of operating the same.

A switching converter or a DC-DC converter converts a pulse signal into a direct current (DC) voltage using an LC low pass filter. In the conversion from current to DC voltage using the LC low pass filter, when the period of a clock signal necessary to generate a pulse width modulation (PWM) signal is short as shown in FIG. 8A, current flowing in an inductor of the LC low pass filter is accumulated during the initial operation of the switching converter.

When excessively accumulated current flows in the inductor, the current may fatally damage the inductor and the switching converter including the inductor.

SUMMARY

According to some embodiments of the inventive concept, there is provided a signal generation circuit including a clock signal generator configured to generate a clock signal and to change a frequency of the clock signal in response to a select signal, a transmission control circuit configured to control transmission of the clock signal based on the select signal, and a counter configured to perform an operation among a count operation and a count stop operation based on an output signal of the transmission control circuit and to output the select signal based on a result of the performed operation.

When the counter performs the count operation in response to the clock signal output from the transmission control circuit, the counter may output a most significant bit (MSB) among count bits of the counter as the select signal.

The counter may perform the count operation in response to the clock signal output from the transmission control circuit and perform the count stop operation in response to a fixed voltage output from the transmission control circuit.

A frequency of the clock signal generated during the count operation may be less than a frequency of the clock signal generated during the count stop operation.

The clock signal generator may include a variable current generator configured to output a charging current whose level changes in response to a level of the select signal; and a frequency changing circuit configured to generate the clock signal and a sawtooth-wave signal, which have the changed frequency, based on the charging current.

The frequency changing circuit may include a capacitor, connected between an output node of the variable current generator and a ground; a comparator configured to compare a reference signal with the sawtooth-wave signal and to output the clock signal; and a switch configured to control connection between the output node of the variable current generator and the ground in response to the clock signal.

The signal generation circuit may further include: a first comparison signal generation circuit configured to generate a first comparison signal based on a result of comparing the sawtooth-wave signal with a first reference signal; and a pulse width modulation signal generator configured to generate a pulse width modulation signal in response to the clock signal and the first comparison signal.

The signal generation circuit may further include: a control signal generator configured to generate control signals, which have a non-overlapping period, in response to the pulse width modulation signal; a driver configured to generate a driving current in response to the control signals; an LC low pass filter connected to an output terminal of the driver; and a second comparison signal generation circuit configured to compare an output signal of the LC low pass filter with a second reference signal and to output the first reference signal based on a result of the comparison The signal generation circuit may be a direct current to direct current (DC-DC) converter.

The transmission control circuit may be an OR gate.

The counter may be a ripple counter.

According to other embodiments of the inventive concept, there is provided a method of operating a signal generation circuit. The method includes generating a first pulse width modulation signal using a clock signal and a sawtooth-wave signal, which have a first frequency, until an MSB among count bits generated by a counter changes; changing a first current generated based on the first pulse width modulation signal into a first DC voltage using an LC low pass filter; generating a second pulse width modulation signal using the clock signal and the sawtooth-wave signal, which have a second frequency, after the MSB changes; and changing a second current generated based on the second pulse width modulation signal into a second DC voltage using the LC low pass filter.

The first frequency may be less than the second frequency.

The method may further include changing a second current of a current source based on the changed MSB and changing the first frequency into the second frequency based on a capacitance of a capacitor and the second current.

The method may further include providing the second DC voltage to a processor.

According to other embodiments of the inventive concept, there is provided a device configured to generate an output voltage. The device comprises: a pulse width modulation signal generator configured to generate a pulse width modulated signal, wherein during an initial time interval after the device is activated, the pulse width modulation signal generator generates the pulse width modulated signal to have an initial frequency and an initial duty cycle, and wherein during an operating time interval following the initial time interval, the pulse width modulation signal generator generates the pulse width modulated signal to have a normal frequency and a normal duty cycle, and wherein at least one of: (1) the normal frequency is different from the initial frequency; and (2) the normal duty cycle is different from the initial duty cycle; and a driver configured to generate, in response to the pulse-width modulated signal, an output current for generating the output voltage, wherein the output current is reduced in the initial time interval compared to during the operating time interval.

The device may further comprise: a clock signal generator configured to output a clock signal and a first signal having a sawtooth waveform, wherein a frequency of the sawtooth waveform has a first value during the initial time interval and has a second value during the operating time interval, wherein the second value is greater than the first value; and a first comparison signal generation circuit configured to compare the first signal to a first reference signal produced in response to the output voltage, and in response to the comparison, to output a first comparison signal, wherein the pulse width modulation signal generator is configured to generate the pulse width modulated signal in response to the clock signal and the first comparison signal.

The device may further comprise: a counter configured to output a count value in response to a masked clock signal, wherein the count value includes a frequency select signal which has a first value during the initial time interval and a second value different from the first value during the operating time interval, and a mask circuit configured to generate the masked clock signal by passing the clock signal to the counter during the initial time interval and passing a fixed voltage to the counter during the operating time interval.

The clock signal generator may comprise: a variable current generator configured to output a charging current whose level changes in response to the value of the frequency select signal; and a frequency changing circuit configured to generate the clock signal and the first signal based on the charging current.

The frequency changing circuit may comprise: capacitor connected between an output node of the variable current generator and a ground; a comparator configured to compare a third reference signal with the first signal and in response thereto to output the clock signal; and a switch configured to control a connection between the output node of the variable current generator and the ground in response to the clock signal

BRIEF DESCRIPTION OF THE DRAWINGS

The above and other features and advantages of the inventive concept will become more apparent upon consideration of certain exemplary embodiments with reference to the attached drawings in which:

FIG. 11 is a flowchart of a method of operating the signal generation circuit illustrated in FIG. 1 according to some embodiments of the inventive concept.

DETAILED DESCRIPTION

The inventive concept will now be described in some additional detail with reference to the accompanying drawings that illustrate certain exemplary embodiments. This inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the drawings like reference numbers and labels are used to indicate like or similar elements and related signals.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
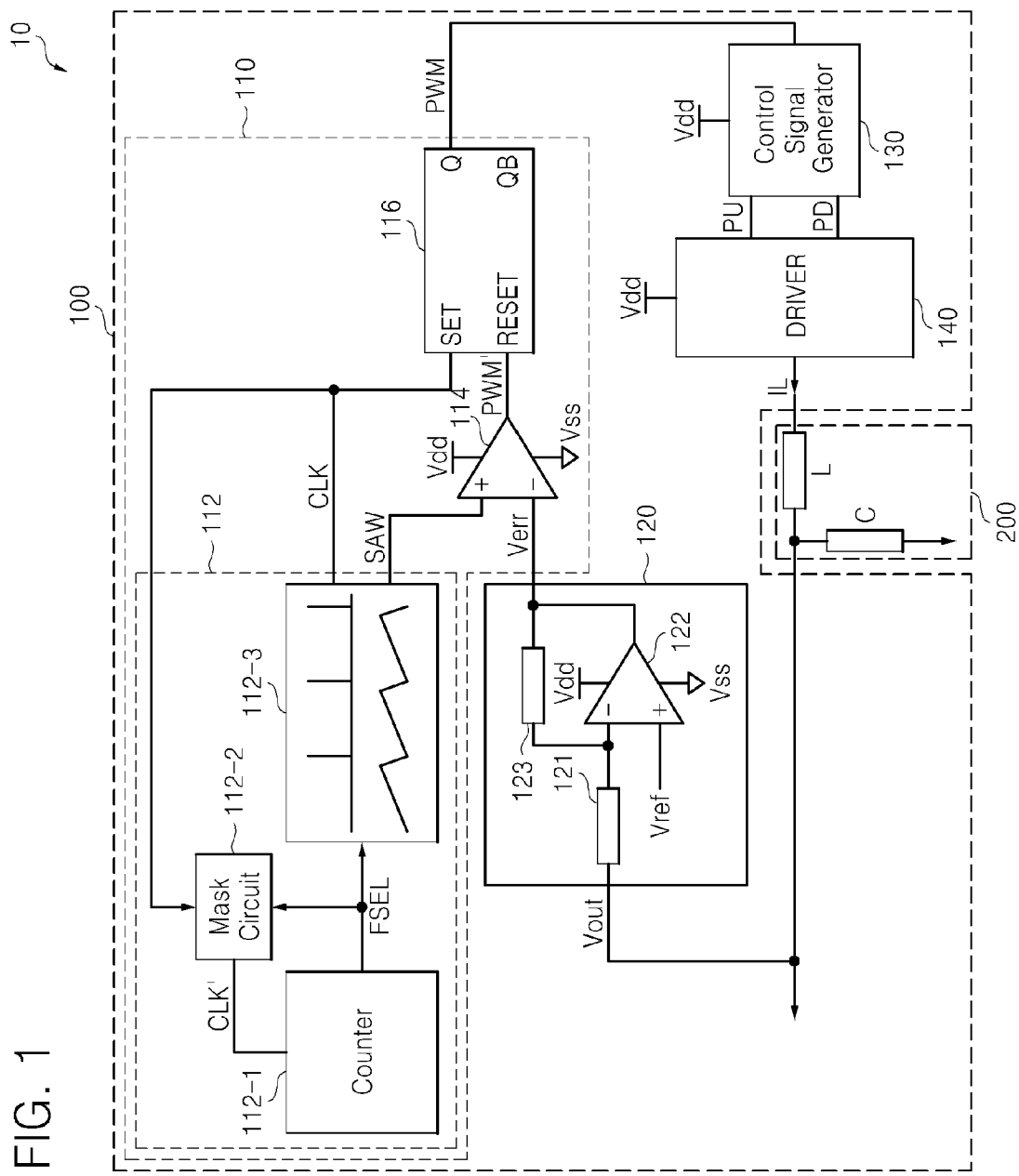
FIG. 1 is a block diagram of a signal generation circuit according to some embodiments of the inventive concept.

FIG. 1 is a block diagram of a signal generation circuit 10 according to some embodiments of the inventive concept. Referring to FIG. 1, signal generation circuit 10 includes a first circuit 100 and a second circuit 200.

Signal generation circuit 10 may be implemented as a switching converter or a direct current to direct current (DC-DC) converter. Signal generation circuit 10 may also be implemented using a printed circuit board (PCB).

First circuit 100 includes a pulse width modulation (PWM) signal generation circuit 110, a second comparison signal generation circuit 120, a control signal generator 130, and a driver 140. First circuit 100 may be implemented as an integrated circuit (IC) or a system on chip (SoC).

PWM signal generation circuit 110 may generate a pulse width modulated signal PWM based on a clock signal CLK, a sawtooth-wave signal SAW, and a first reference signal Verr. PWM signal generation circuit 110 includes a clock signal generation circuit 112, a first comparison signal generation circuit 114, and a PWM signal generator 116.

Clock signal generation circuit 112 may generate the clock signal CLK having a different frequency depending on the level of a select signal FSEL (e.g., a frequency select signal). Clock signal generation circuit 112 may also generate the sawtooth-wave signal SAW having a different frequency depending on the level of the select signal FSEL. The frequency of the clock signal CLK may be the same as the frequency of the sawtooth-wave signal SAW. The operation of the signal generation circuit 112 will be described in detail with reference to FIGS. 2 through 6 later.

First comparison signal generation circuit 114 may compare the sawtooth-wave signal SAW with the first reference signal Verr and generate a first comparison signal PWM' based on the result of the comparison. First comparison signal generation circuit 114 may be implemented by a comparator using a power supply voltage Vdd and a ground voltage Vss as operating voltages.

The comparator may include a first input terminal (e.g., a positive (+) input terminal) receiving the sawtooth-wave signal SAW, a second input terminal (e.g., a negative (−) input terminal) receiving the first reference signal Verr, and an output terminal outputting the first comparison signal PWM', e.g., a pulse width modulated signal PWM', generated based on the result of comparing the sawtooth-wave signal SAW with the first reference signal Verr.

The PWM signal generator 116 may generate the pulse width modulated signal PWM in response to the clock signal CLK and the first comparison signal PWM'. PWM signal generator 116 may be implemented by a set-reset (SR) latch or an SR flip-flop. PWM signal generator 116 may include a set input terminal SET receiving the clock signal CLK as a set signal, a reset input terminal RESET receiving the first comparison signal PWM' as a reset signal, and an output terminal Q outputting the pulse width modulated signal PWM.

Second comparison signal generation circuit 120 may compare a direct current (DC) voltage Vout output from second circuit 200, e.g., an LC low pass filter, with a second reference signal Vref and output the first reference signal Verr based on the result of the comparison. Second comparison signal generation circuit 120 may include a first resistor 121, a comparator 122, and a second resistor 123.

First resistor 121 is connected to a second (−) input terminal of comparator 122. Second resistor 123 is connected between the second input terminal "−" of comparator 122 and an output terminal of comparator 122. Comparator 122 compares the second reference signal Vref input to a first (+) input terminal with a voltage input to the second input terminal and outputs the first reference signal Verr based on the result of the comparison.

Control signal generator 130 may generate control signals PU and PD having a non-overlapping period in response to the pulse width modulated signal PWM.

Driver 140 may provide a driving current, e.g., an inductor current, IL to second circuit 200 in response to the control signals PU and PD.

Figure 2:
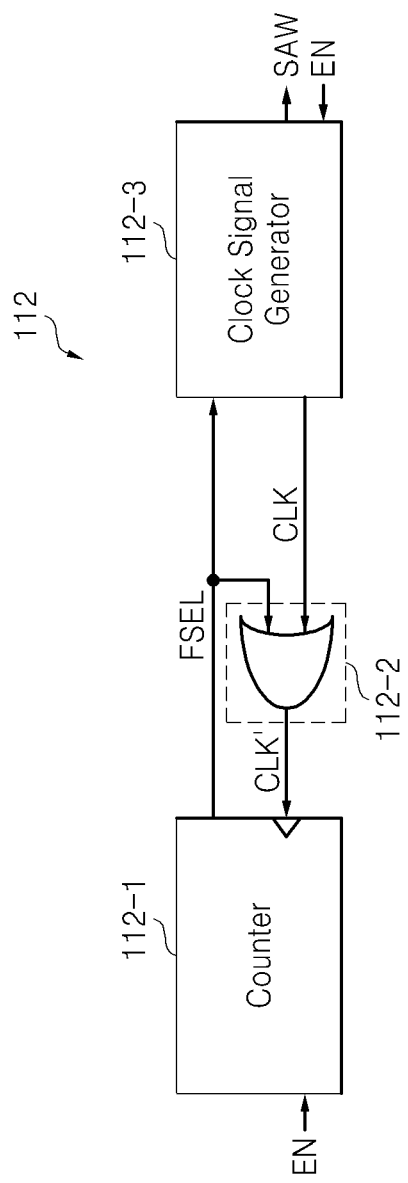
FIG. 2 is a block diagram of one embodiment of a clock signal generation circuit illustrated in FIG. 1.
Figure 3:
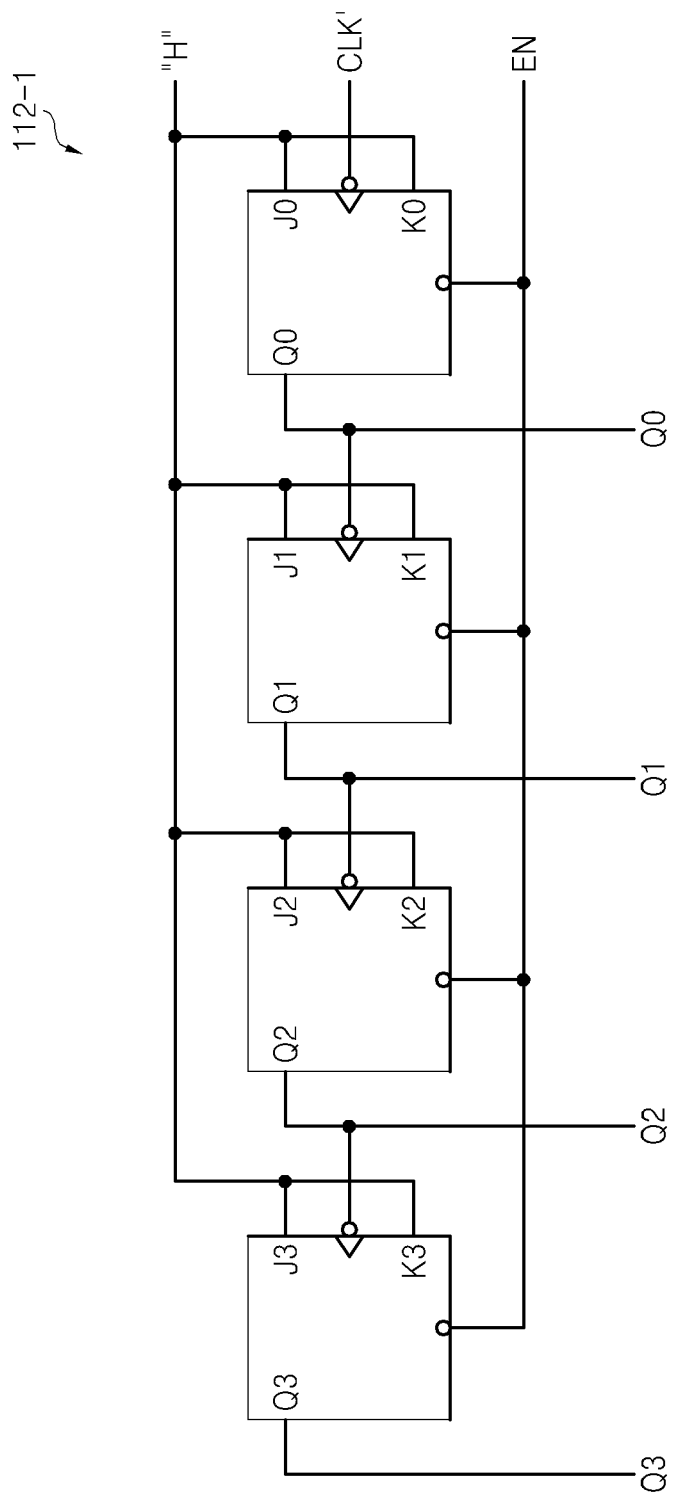
FIG. 3 is a circuit diagram of one embodiment of a counter illustrated in FIG. 1.
Figure 4:
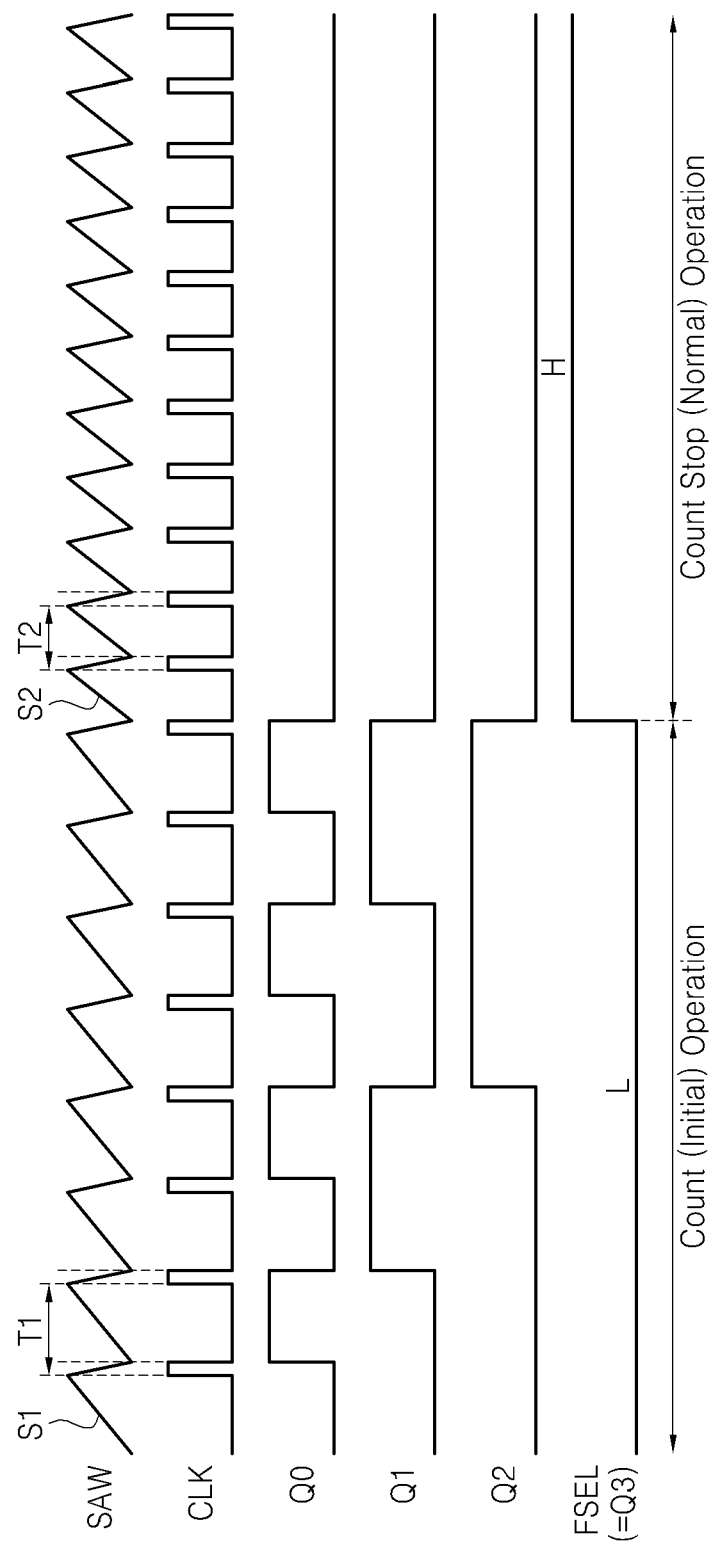
FIG. 4 is a diagram of example waveforms in the clock signal generation circuit illustrated in FIG. 1.

FIG. 2 is a block diagram of one embodiment of clock signal generation circuit 112 illustrated in FIG. 1. FIG. 3 is a circuit diagram of one embodiment of a counter 112-1 illustrated in FIGS. 1 and 2. FIG. 4 is a diagram of example waveforms in the clock signal generation circuit 112 illustrated in FIG. 1. Referring to FIGS. 1 through 4, clock signal generation circuit 112 includes counter 112-1, mask circuit 112-2, and clock signal generator 112-3.

Counter 112-1 and clock signal generator 112-3 are initialized in response to an enable signal EN at a low level. Counter 112-1 may perform a count operation (or an initial operation) followed by a count stop operation (or a normal operation) in response to the enable signal EN going to a high level.

When enable signal EN is at the high level, clock signal generator 112-3 may generate the clock signal CLK and the sawtooth-wave signal SAW in response to the select signal FSEL.

Counter 112-1 may perform an operation among the count operation and the count stop operation based on an output signal CLK' of the mask circuit 112-2, and may output the select signal FSEL based on a result of performing the operation. Counter 112-1 may be implemented by a ripple counter, as shown in FIG. 3. Although for ease of description the structure and the waveforms of input/output signals of a 4-bit ripple counter are illustrated in FIGS. 3 and 4, in general counter 112-1 may be implemented by an N-bit counter, where N is a natural number.

Each of a series of JK flip-flops in 4-bit ripple counter 112-1 is initialized to a low output level in response to the enable signal EN at the low level. Ripple counter 112-1 is toggled in response to a falling edge of the output signal CLK' of the mask circuit 112-2.

Mask circuit 112-2 may control the transmission of the clock signal CLK based on the level of the select signal FSEL. Accordingly, mask circuit 112-2 may be referred to as a transmission control circuit. Mask circuit 112-2 may be implemented by an OR gate.

As shown in FIGS. 2 and 4, when the select signal FSEL is at a low level L, mask circuit 112-2 transmits the clock signal CLK to counter 112-1 as the output signal CLK'. Accordingly, counter 112-1 may perform the count operation, for example, output 4 count bits Q0 through Q3, in response to the clock signal CLK=CLK'.

However, when the select signal FSEL is at a high level H, mask circuit 112-2 transmits a signal at a high level to counter 112-1 as the output signal CLK'. At this time, the clock signal CLK is masked, and therefore, counter 112-1 stops the count operation, which is referred to as the count stop operation or the normal operation. As shown in FIG. 4, the select signal FSEL may be the most significant bit (MSB) Q3 among the 4 count bits Q0 through Q3. Accordingly, at the end of an initial time interval where counter 112-1 performs the count operation, once counter 112-1 has counted up to the MSB (Q3), toggling FSEL to the high H level, then further counting by counter 112-1 is inhibited by the output CLK' of mask circuit 112-2 and FSEL remains thereafter at the high H level, and counter 112-1 remains in the count stop mode during a subsequent time interval corresponding to normal operation of signal generation circuit 10.

Clock signal generator 112-3 may generate the clock signal CLK and the sawtooth-wave signal SAW both of whose frequency is changed in response to the level of the select signal FSEL.

Figure 5:
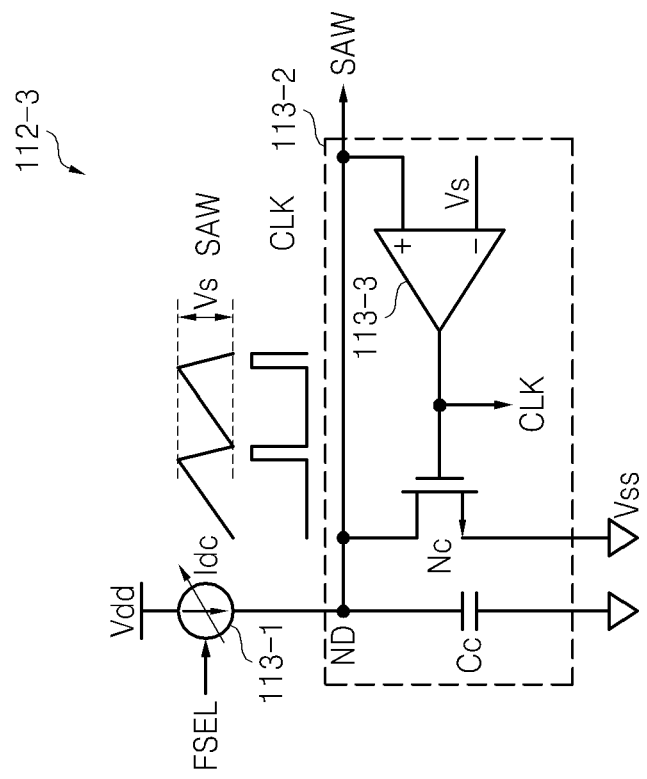
FIG. 5 is a circuit diagram of one embodiment of a clock signal generator illustrated in FIG. 1.
Figure 6:
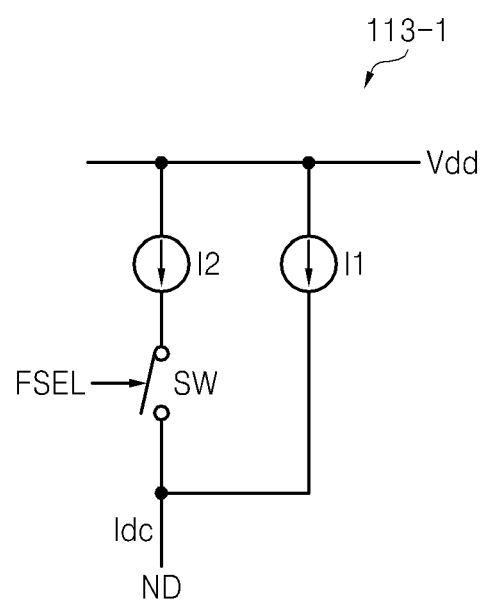
FIG. 6 is a circuit diagram of one embodiment of a variable current generator illustrated in FIG. 5.

FIG. 5 is a circuit diagram of one embodiment of clock signal generator 112-3 illustrated in FIG. 1. FIG. 6 is a circuit diagram of one embodiment of a variable current generator 113-1 illustrated in FIG. 5. Referring to FIGS. 1, 2, 4, 5, and 6, clock signal generator 112-3 includes variable current generator 113-1 and a frequency changing circuit 113-2.

Variable current generator 113-1 may output a charging current Idc corresponding to the level of the select signal FSEL. As shown in FIG. 6, when variable current generator 113-1 includes current sources I1 and I2 and a switch SW, the charging current Idc of the variable current generator 113-1 changes depending on whether the switch SW is opened (disconnected) or closed (connected), where the connection and disconnection of the switch SW may be determined by the level of the select signal FSEL. For instance, when the switch SW is implemented by an N-channel metal oxide semiconductor (NMOS) transistor, the switch SW is connected (closed) in response to the select signal FSEL being at the high level.

Frequency changing circuit 113-2 determines or sets a resonance frequency, e.g., the frequency of the clock signal CLK and the frequency of the sawtooth-wave signal SAW, based on the charging current Idc output from variable current generator 113-1, together with the capacitance of a capacitor Cc. Here, the sawtooth-wave signal SAW and the clock signal CLK are related to each other.

Frequency changing circuit 113-2 includes the capacitor Cc, a comparator 113-3, and a switch Nc. The capacitor Cc is connected between an output node ND of variable current generator 113-1 and the ground Vss. Frequency changing circuit 113-2 may also include a discharge circuit (not shown), which discharges charge from the capacitor Cc to the ground Vss in response to the enable signal EN at the low level.

Comparator 113-3 compares the sawtooth-wave signal SAW of the output node ND with a third reference signal Vs and outputs the clock signal based on the result of the comparison. The sawtooth-wave signal SAW may swing within the range of the third reference signal Vs.

The switch Nc controls the connection between the output node ND and the ground Vss in response to the clock signal CLK. The switch Nc may be implemented by an NMOS transistor.

The oscillation frequency of the clock signal generator 112-3 is determined by the charging current Idc and the capacitance of the capacitor Cc. In other words, according to a formula of "Q=CV=i*t", the oscillation frequency "f" is determined by f=1/t=CV/Idc, where Q is charge at the capacitor Cc, C is the capacitance of the capacitor Cc, and "i" is the charging current Idc supplied to the capacitor Cc. Here, the frequency of the sawtooth-wave signal SAW is the same as the frequency of the clock signal CLK.

Referring to FIGS. 4 and 6, the switch SW is implemented by an NMOS transistor; and the charging current Idc flowing in variable current generator 113-1 when the select signal FSEL (=Q3) is at the low level L is less than the charging current Idc flowing in variable current generator 113-1 when the select signal FSEL (=Q3) is at the high level H. In other words, when the charging current Idc increases, the frequency of the clock signal CLK and the sawtooth-wave signal SAW increases and the period decreases.

A period T1 of the signal CLK and/or SAW when the select signal FSEL (=Q3) is at the low level L is longer than a period T2 of the signal CLK and/or SAW when the select signal FSEL (=Q3) is at the high level H. In other words, the frequency of the signal CLK and/or SAW when the select signal FSEL (=Q3) is at the low level L is less than the frequency of the signal CLK and/or SAW when the select signal FSEL (=Q3) is at the high level H.

While the select signal FSEL (=Q3) is at the low level L, that is, while counter 112-1 is performing the count operation (or the initial operation), clock signal generator 112-3 outputs the signal CLK and/or SAW having the first period T1. However, while the select signal FSEL (=Q3) is at the high level H, that is, while counter 112-1 is performing the count stop operation (or the normal operation), clock signal generator 112-3 outputs the signal CLK and/or SAW having the second period T2 shorter than the first period T1.

A rising slope S1 of the sawtooth-wave signal SAW having the first period T1 is less than a rising slope S2 of the sawtooth-wave signal SAW having the second period T2. At this time, the duty ratio (or duty cycle) of the clock signal CLK having the first period T1 is the same as that of the clock signal CLK having the second period T2. In response to the clock signal CLK, and the sawtooth-wave signal SAW via first comparison signal generation circuit 114, PWM signal generator 116 outputs the pulse-width modulated signal PWM. When the frequency of clock signal CLK and the sawtooth-wave signal SAW are changed by clock signal generator 112-3, then the frequency and/or the duty cycle of pulse width of the pulse-width modulated signal PWM is/are also changed. In particular, during an initial time interval when the frequency of clock signal CLK and the sawtooth-wave signal SAW has a first value, then the frequency and the duty cycle (or pulse width) of the pulse width modulated signal PWM have initial values. Then, during a subsequent operating time interval (e.g., during normal operation), when the frequency of clock signal CLK and the sawtooth-wave signal SAW has a second value which is greater than the first value, the frequency and/or the duty cycle (or pulse width) of the pulse width modulated signal PWM have operating values, where at least one of the operating values is different from the corresponding initial value. For example, the initial frequency of the pulse width modulated signal PWM during the initial time interval may be less than the operating frequency of the pulse width modulated signal PWM during the subsequent operating time interval corresponding to normal operation.

Figure 7:
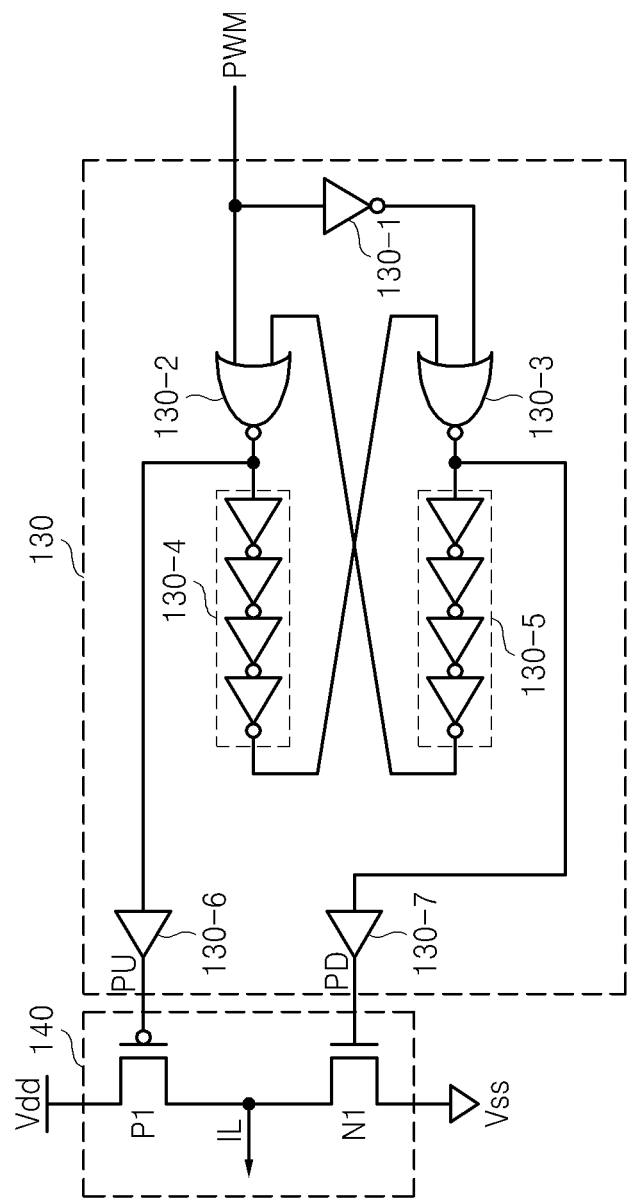
FIG. 7 is one embodiment of a circuit diagram of a control signal generator and a driver illustrated in FIG. 1.

FIG. 7 is a circuit diagram of one embodiment of control signal generator 130 and driver 140 illustrated in FIG. 1. Referring to FIG. 7, control signal generator 130 generates the control signals PU and PD, which have a non-overlapping period, in response to the pulse width modulated signal PWM. Driver 140 provides the driving current IL to LC low pass filter 200 in response to the control signals PU and PD.

Control signal generator 130 and driver 140 use the power supply voltage Vdd and the ground voltage as operating voltages. Control signal generator 130 includes an inverter 130-1, a first NOR gate 130-2, a second NOR gate 130-3, a first delay chain 130-4, a second delay chain 130-5, a first buffer 130-6, and a second buffer 130-7.

Inverter 130-1 inverts the pulse width modulated signal PWM. First NOR gate 130-2 performs a NOR operation on the pulse width modulated signal PWM and an output signal of second delay chain 130-5. Second NOR gate 130-3 performs a NOR operation on an output signal of inverter 130-1 and an output signal of first delay chain 130-4.

First delay chain 130-4 delays an output signal of first NOR gate 130-2. Second delay chain 130-5 delays an output signal of second NOR gate 130-3. Each of first and second delay chains 130-4 and 130-5 includes an even number of inverters connected in series.

First buffer 130-6 buffers the output signal of first NOR gate 130-2 to generate the first control signal PU. Second buffer 130-7 buffers the output signal of second NOR gate 130-3 to generate the second control signal PD. The first control signal PU and the second control signal PD do not overlap with each other. Apart from the non-overlapping period, the first control signal PU and the second control signal PD are complementary to each other.

Driver 140 includes a pull-up circuit P1 and a pull-down circuit N1, which are connected in series between a power supply node providing the power supply voltage Vdd and the ground Vss. Due to the control signals PU and PD having a non-overlapping period, the pull-up circuit P1 and the pull-down circuit N1 are not turned on simultaneously.

The pull-up circuit P1 is implemented by a P-channel metal oxide semiconductor (PMOS) transistor and provides the power supply voltage Vdd to an output node in response to the first control signal PU at a low level. The pull-down circuit N1 is implemented by an NMOS transistor and pulls down a voltage at the output node to the ground Vss in response to the second control signal PD at a high level.

Figure 8:
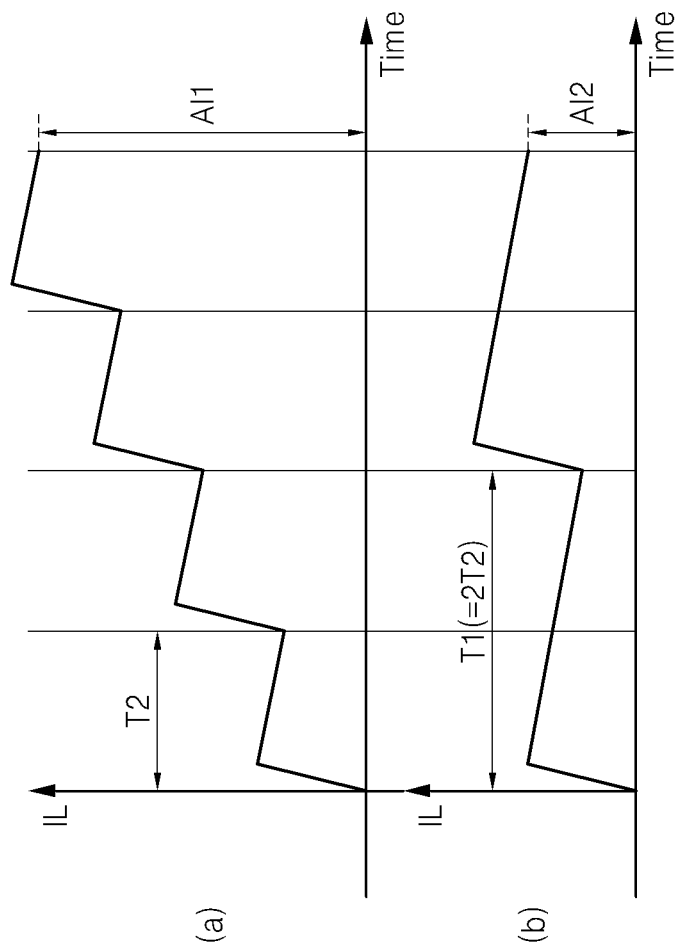
FIGS. 8A and 8B are graphs illustrating current accumulated at an inductor of an LC low pass filter with respect to the period of a clock signal.

FIGS. 8A and 8B are graphs showing current accumulated at an inductor of an LC low pass filter with respect to the period of a clock signal.

Referring to FIG. 8A, a conventional clock signal generation circuit that does not include elements corresponding to counter 112-1 and mask circuit 112-2 generates a clock signal and a sawtooth-wave signal, which have a second period T2. In other words, the conventional clock signal generation circuit generates a clock signal and a PWM signal, which have a constant period, all the time without distinguishing operations. Accordingly, an amount AI1 of inductor current, i.e., driving current IL accumulated at the inductor included in the LC low pass filter is very large.

In contrast, as shown in FIGS. 4 and 8B, clock signal generation circuit 112 generates the clock signal CLK and the sawtooth-wave signal SAW, which have a first period T1 longer than the second period T2 during an initial operation. Accordingly, an amount AI2 of the inductor current IL accumulated at an inductor L included in the LC low pass filter 200 is much less than the amount AI1 illustrated in FIG. 8A. For ease of description, it is illustrated in FIGS. 8A and 8B that the first period T1 is double the second period T2, but in general, the period of T1 may have any value greater than the period of T2.

Current accumulation at the inductor L in signal generation circuit 10, e.g., a switching converter, occurs during the initial operation, e.g., within several tens of cycles of the clock signal CLK. Accordingly, as shown in FIG. 4, when the first period T1 of the clock signal CLK during the initial operation is longer than the second period T2 of the clock signal CLK during the normal operation, the current accumulation at the inductor L can be reduced.

Figure 9:
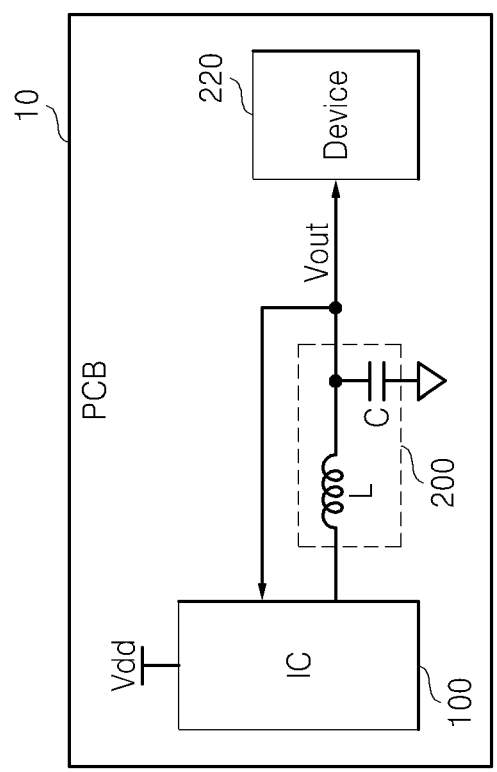
FIG. 9 is an example of the implementation of the signal generation circuit illustrated in FIG. 1.

FIG. 9 is an example of the implementation of signal generation circuit 10 illustrated in FIG. 1. Referring to FIG. 9, signal generation circuit 10 includes first circuit 100, second circuit 200, and a third circuit 220.

Third circuit 220 may include a device that is able to use an output signal Vout, e.g., a DC voltage, of second circuit 200. Third circuit 200 may be a central processing unit (CPU) or a processor, but it is not restricted thereto.

Figure 10:
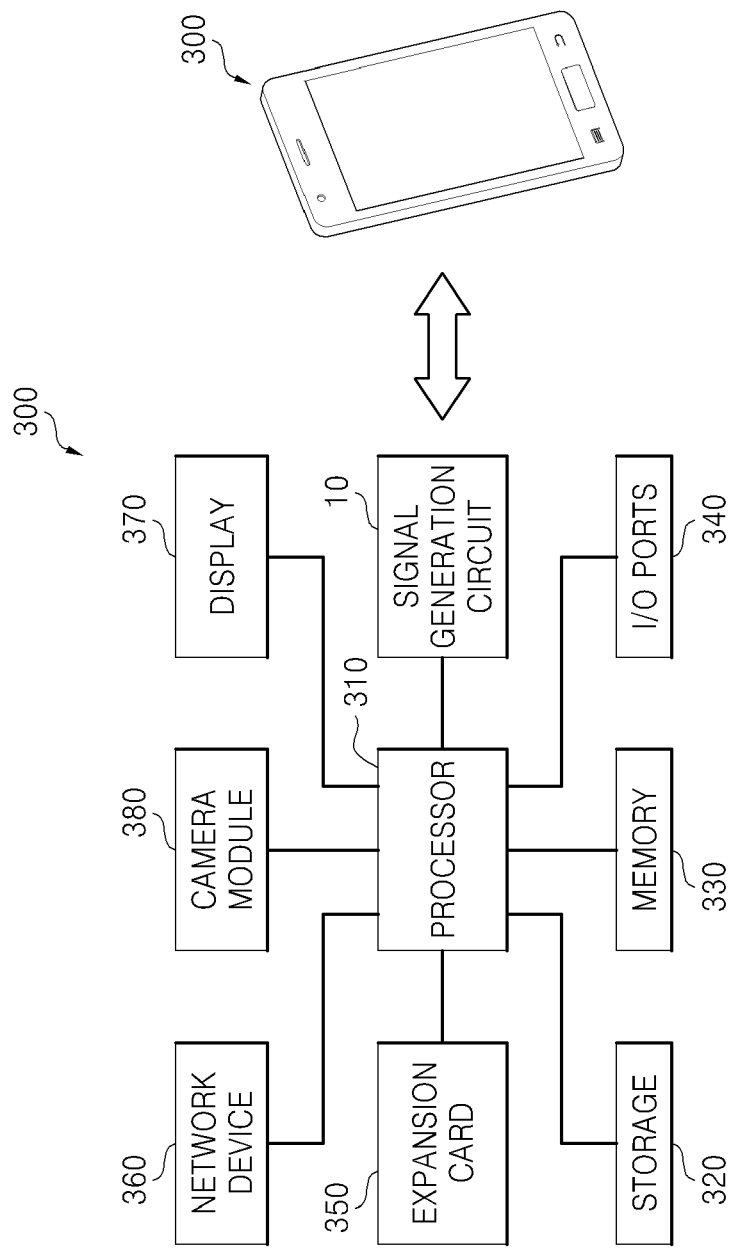
FIG. 10 is a block diagram of a data processing system including the signal generation circuit illustrated in FIG. 1.

FIG. 10 is a block diagram of a data processing system 300 including signal generation circuit 10 illustrated in FIG. 1. Referring to FIGS. 1 through 10, data processing system 300 includes a processor 310, signal generation circuit 10, a storage device 320, a memory device 330, input/output (I/O) ports 340, an extension card 350, a network device 360, and a display 370. The data processing system 300 may also include a camera module 380.

Although processor 310 is illustrated in FIG. 10 as being separated from signal generation circuit 10, signal generation circuit 10 may be implemented as a part of processor 310.

Processor 310 may be implemented as an integrated circuit (IC) or a system on a chip (SoC). Processor 310 may be a multi-core processor. Processor 310 may control the operation of at least one of the other elements 320 through 380.

Signal generation circuit 10 may provide the operating voltage Vout to at least one of elements 310 through 380. Storage device 320 may be implemented as a hard disk drive (HDD) or a solid state drive (SSD).

Memory device 330 may be implemented by a volatile memory or a non-volatile memory. A memory controller, which controls a data access operation, e.g., a read operation, a write (or program) operation, or an erase operation, with respect to the memory 330, may be integrated or embedded in the processor 310. Alternatively, the memory controller may be disposed between the processor 310 and the memory 330.

The I/O ports 340 may transmit data to data storage device 320 and/or memory device 330, or transmit data from data storage device 320 and/or memory device 330 to an external device. I/O ports 340 may be a port for the connection of a pointing device such as a computer mouse, a port for the connection of a printer, or a port for the connection of a universal serial bus (USB) drive.

Extension card 350 may be a secure digital (SD) card, a multimedia card (MMC), a subscriber identity module (SIM) card, or a universal SIM (USIM) card.

Network device 360 enables data processing system 300 to be connected to a wired or wireless network.

Display 370 may display data output from storage device 320, memory device 330, I/O ports 340, extension card 350, or network device 360.

Camera module 380 may convert an optical image into an electrical image. The electrical image output from camera module 380 may be stored in storage device 320 and/or the memory 330, or extension card 350. The electrical image output from camera module 380 may also be displayed through display 370.

Data processing system 300 may be implemented as a portable device. Portable device 300 may be a mobile telephone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, or an e-book.

FIG. 11 is a flowchart of a method of operating signal generation circuit 10 illustrated in FIG. 1 according to some embodiments of the inventive concept. Referring to FIG. 11, signal generation circuit 10 generates a first pulse width modulated signal PWM using a clock signal CLK and a sawtooth-wave signal SAW, which have a first frequency, during an initial operation, that is, while a select signal FSEL is at a low level in operation S110.

Signal generation circuit 10 changes a first current IL generated based on the first PWM signal PWM into a first DC voltage Vout using LC low pass filter 200. Signal generation circuit 10 generates a second pulse width modulated signal PWM using a clock signal CLK and a sawtooth-wave signal SAW, which have a second frequency, during a normal operation, that is, while the select signal FSEL is at a high level in operation S120. Signal generation circuit 10 changes a second current IL generated based on the second pulse width modulated signal PWM into a second DC voltage Vout using LC low pass filter 200.

As illustrated in FIG. 9, the first DC voltage Vout and/or the second DC voltage Vout output from LC low pass filter 200 may be provided to third circuit 220.

As described above, according to some embodiments of the inventive concept, a signal generation circuit enables the period of a clock signal generated during the initial operation of a DC-DC converter to be longer than the period of a clock signal generated during the normal operation. Consequently, current flowing in an inductor of an LC low pass filter is decreased during the initial operation of the DC-DC converter, and therefore, current accumulation at the inductor is reduced.

While the present inventive concept has been particularly shown and described with reference to exemplary embodiments thereof, it will be understood by those of ordinary skill in the art that various changes in forms and details may be made therein without departing from the scope of the following claims.

What is claimed is:

1. A signal generation circuit comprising:
a clock signal generator configured to generate a clock signal and to change a frequency of the clock signal in response to a select signal;
a transmission control circuit configured to control transmission of the clock signal based on the select signal; and
a counter configured to perform an operation among a count operation and a count stop operation based on an output signal of the transmission control circuit, and to output the select signal based on a result of the performed operation.

2. The signal generation circuit of claim 1, wherein when the counter performs the count operation in response to the clock signal output from the transmission control circuit, the counter outputs a most significant bit (MSB) among count bits of the counter as the select signal.

3. The signal generation circuit of claim 1, wherein the counter performs the count operation in response to the clock signal output from the transmission control circuit and performs the count stop operation in response to a fixed voltage signal output from the transmission control circuit.

4. The signal generation circuit of claim 1, wherein a frequency of the clock signal generated during the count operation is less than a frequency of the clock signal generated during the count stop operation.

5. The signal generation circuit of claim 1, wherein the clock signal generator includes:
a variable current generator configured to output a charging current whose level changes in response to a level of the select signal; and
a frequency changing circuit configured to generate the clock signal and a sawtooth-wave signal, which have the changed frequency, based on the charging current.

6. The signal generation circuit of claim 5, wherein the frequency changing circuit includes:
a capacitor connected between an output node of the variable current generator and a ground;
a comparator configured to compare a reference signal with the sawtooth-wave signal and to output the clock signal; and
a switch configured to control a connection between the output node of the variable current generator and the ground in response to the clock signal.

7. The signal generation circuit of claim 5, further comprising:
a first comparison signal generation circuit configured to generate a first comparison signal based on a result of comparing the sawtooth-wave signal with a first reference signal; and
a pulse width modulation signal generator configured to generate a pulse width modulation signal in response to the clock signal and the first comparison signal.

8. The signal generation circuit of claim 7, further comprising:
a control signal generator configured to generate control signals, which have a non-overlapping period, in response to the pulse width modulation signal;
a driver configured to generate a driving current in response to the control signals;
an LC low pass filter connected to an output terminal of the driver; and
a second comparison signal generation circuit configured to compare an output signal of the LC low pass filter with a second reference signal and to output the first reference signal based on a result of the comparison.

9. The signal generation circuit of claim 8, wherein the signal generation circuit is a direct current to direct current (DC-DC) converter.

10. The signal generation circuit of claim 1, wherein the transmission control circuit is an OR gate.

11. The signal generation circuit of claim 1, wherein the counter is a ripple counter.

12. A method of operating a signal generation circuit, the method comprising:
generating a first pulse width modulation signal using a clock signal and a sawtooth-wave signal, which have a first frequency, until a most significant bit (MSB) among count bits generated by a counter changes;
changing a first current generated based on the first pulse width modulation signal into a first direct current (DC) voltage using an LC low pass filter;
generating a second pulse width modulation signal using the clock signal and the sawtooth-wave signal, which have a second frequency, after the MSB changes; and
changing a second current generated based on the second pulse width modulation signal into a second DC voltage using the LC low pass filter.

13. The method of claim 12, wherein the first frequency is less than the second frequency.

14. The method of claim 12, further comprising:
changing a second current of a current source based on the changed MSB; and
changing the first frequency into the second frequency based on a capacitance of a capacitor and the second current.

15. The method of claim 12, further comprising providing the second DC voltage to a processor.

16. A device configured to generate an output voltage, the device comprising:
a pulse width modulation signal generator configured to generate a pulse width modulated signal, wherein during an initial time interval after the device is activated, the pulse width modulation signal generator generates the pulse width modulated signal to have an initial frequency and an initial duty cycle, and wherein during an operating time interval following the initial time interval, the pulse width modulation signal generator generates the pulse width modulated signal to have a normal frequency and a normal duty cycle, and wherein at least one of: (1) the normal frequency is different from the initial frequency; and (2) the normal duty cycle is different from the initial duty cycle;
a driver configured to generate, based on the pulse-width modulated signal, an output current for generating the output voltage, wherein the output current is reduced in the initial time interval compared to during the operating time interval;
a clock signal generator configured to output a clock signal and a first signal having a sawtooth waveform, wherein a frequency of the sawtooth waveform has a first value during the initial time interval and has a second value during the operating time interval, wherein the second value is greater than the first value; and
a first comparison signal generation circuit configured to compare the first signal to a first reference signal produced in response to the output voltage, and in response to the comparison, to output a first comparison signal, wherein the pulse width modulation signal generator is configured to generate the pulse width modulated signal in response to the clock signal and the first comparison signal.

17. The device of claim 16, further comprising:
a counter configured to output a count value in response to a masked clock signal, wherein the count value includes a frequency select signal which has a first value during the initial time interval and a second value different from the first value during the operating time interval, and
a mask circuit configured to generate the masked clock signal by passing the clock signal to the counter during the initial time interval and passing a fixed voltage to the counter during the operating time interval.

18. The device of claim 17, wherein the clock signal generator comprises:
a variable current generator configured to output a charging current whose level changes in response to the value of the frequency select signal; and
a frequency changing circuit configured to generate the clock signal and the first signal based on the charging current.

19. The device of claim 18, wherein the frequency changing circuit comprises:
a capacitor connected between an output node of the variable current generator and a ground;
a comparator configured to compare a third reference signal with the first signal and in response thereto to output the clock signal; and
a switch configured to control a connection between the output node of the variable current generator and the ground in response to the clock signal.

* * * * *